US006876528B2

United States Patent
Macbeth (10) Patent No.: US 6,876,528 B2
(45) Date of Patent: *Apr. 5, 2005

(54) TWO WINDING RESONATING ARC FAULT SENSOR WHICH BOOSTS ARC FAULT SIGNALS WHILE REJECTING ARC MIMICKING NOISE

(75) Inventor: Bruce F. Macbeth, Syracuse, NY (US)

(73) Assignee: Passi Seymour, Inc., Syracuse, NY (US)

( * ) Notice: Subject to any disclaimer, the term of this patent is extended or adjusted under 35 U.S.C. 154(b) by 231 days.

This patent is subject to a terminal disclaimer.

(21) Appl. No.: 10/287,893

(22) Filed: Nov. 5, 2002

(65) Prior Publication Data

US 2003/0058596 A1 Mar. 27, 2003

Related U.S. Application Data

(63) Continuation-in-part of application No. 10/029,762, filed on Oct. 29, 2001, now Pat. No. 6,608,741, which is a continuation of application No. 09/518,528, filed on Mar. 4, 2000, now abandoned.

(51) Int. Cl.[7] .............................................. H02H 3/00
(52) U.S. Cl. ....................................................... 361/42
(58) Field of Search ......................... 361/42, 100, 93.5

(56) References Cited

U.S. PATENT DOCUMENTS

| | | | | |
|---|---|---|---|---|
| 3,611,053 A | * | 10/1971 | Rowell | 361/160 |
| 5,986,860 A | * | 11/1999 | Scott | 361/42 |
| 6,181,066 B1 | * | 1/2001 | Adamson | 315/282 |
| 6,339,525 B1 | * | 1/2002 | Neiger et al. | 361/42 |
| 6,421,214 B1 | * | 7/2002 | Packard et al. | 361/7 |
| 6,433,977 B1 | * | 8/2002 | Macbeth | 361/42 |
| 6,608,741 B1 | * | 8/2003 | Macbeth | 361/42 |

* cited by examiner

Primary Examiner—Brian Sircus
Assistant Examiner—James Demakis
(74) Attorney, Agent, or Firm—Daniel P. Malley; Bond, Schoeneck & King, PLLC (57) ABSTRACT

A fault detector sensor includes a current transformer, with two multi-turn windings each formed around a portion of the core, with one winding adjacent to each of the hot and neutral wires of the power line being protected. Both windings are connected in series in a way which reinforces arc fault noise generated by arc faults involving the line and neutral, but which causes signal reduction for noise signals from the line and neutral, or either, to ground. The windings and core are selected to self resonate at a frequency that excludes power line carrier frequencies but which includes arc fault frequencies. The core optionally has a third winding, forming a grounded neutral transformer, or ground fault detector. Instead of a third winding, one of the arc fault sensing windings can act as a dual function sensor.

48 Claims, 6 Drawing Sheets

TWO WINDING RESONATING ARC FAULT SENSOR WHICH BOOSTS ARC FAULT SIGNALS WHILE REJECTING ARC MIMICKING NOISE

CROSS-REFERENCE TO RELATED APPLICATIONS

This application is a continuation in part which claims priority from U.S. application Ser. No. 10/029,762 filed Oct. 29, 2001 now U.S. Pat. No. 6,608,741 and entitled TWO WINDING RESONATING ARC FAULT SENSOR WHICH BOOSTS ARC FAULT SIGNALS WHILE REJECTING ARC MIMICKING NOISE, which in turn is a continuation of and claims priority from U.S. application Ser. No. 09/518,528 filed Mar. 4, 2000 now abandoned and entitled TWO WINDING RESONATING ARC FAULT SENSOR WHICH BOOSTS ARC FAULT SIGNALS WHILE REJECTING ARC MIMICKING NOISE, abandoned, both of which are incorporated herein by reference.

FIELD OF THE INVENTION

This invention relates generally to a small economical current sensor that can be used in an inexpensive Arc Fault Circuit Interrupter (AFCI) that may also provide ground fault protection, and more particularly to an arc fault current sensor which rejects noise currents from either the hot, neutral, or both lines to ground, while providing strong signal response to arc faults, and which optionally acts as a grounded neutral transformer, or ground fault detector, when used in a combination AFCI/GFCI device.

BACKGROUND OF THE INVENTION

Arc detection is an enhancement to thermal and magnetic overload detection typically used in circuit breakers, which may not otherwise detect and respond to arc faults. A number of devices for detecting arc faults and methods of detection have been used in the past. These include E and B field arc sensors, detecting the magnitude of the rate of change of current signals when an arc fault occurs, the use of non-overlapping band pass filters to detect white noise characteristic of arcs, and detecting the disappearance of signals indicating the presence of arcs near zero current crossings. While some of these techniques are more or less effective, they require relatively sophisticated arc sensors and circuits. Heretofore, most arc detection circuits have been incorporated in circuit breakers because, among other things, the circuits were too large to fit in a wiring device such as a receptacle.

There is a need for simple economical arc fault detectors that can be included in wiring devices such as receptacles, plugs, or in-line devices, and that offer the same protection as an arc fault detector incorporated in a circuit breaker, but at lower cost. There is a need for an arc fault detector in wiring devices that can be provided at a reduced cost compared with arc fault detecting circuit breakers which is comparable to the reduction in cost achieved between ground fault interrupting receptacles and ground fault interrupting circuit breakers. There is a need for a sensor and associated circuitry for an AFCI that is miniaturized. There is also a need for a sensor and associated circuitry that effectively senses and allows protection against both arc faults and power line grounded neutral faults.

SUMMARY OF THE INVENTION

Briefly stated, a fault detector sensor includes a current transformer, with two multi-turn windings each formed around a portion of the core, with one winding adjacent to each of the hot and neutral wires of the power line being protected. Both windings are connected in series in a way which reinforces arc fault noise generated by arc faults involving the line and neutral, but which causes signal reduction for noise signals from the line and neutral, or either, to ground. The windings and core are selected to self resonate at a frequency that excludes power line carrier frequencies but which includes arc fault frequencies. The core optionally has a third winding, forming a grounded neutral transformer, or ground fault detector. Instead of a third winding, one of the arc fault sensing windings can act as a dual function sensor.

According to an embodiment of the invention, a sensor for an arc fault detecting device for protecting an electric power circuit including a neutral wire and a hot wire includes a transformer with the neutral and hot wires forming primaries, a first secondary winding wound next to the hot wire, and arranged to receive more of the hot wire flux than the neutral wire flux; a second secondary winding wound next to the neutral wire, and arranged to receive more of the neutral wire flux than the hot wire flux, wherein the first and second secondary windings are connected as signal series adding for currents carried by the hot, neutral, or both which do not involve ground, and signal series opposing for currents carried by either the hot, neutral, or both which involve ground.

According to an embodiment of the invention, an arc fault circuit interrupter includes a transformer having a first core section which partially surrounds the hot wire; and a second core section which partially surrounds the neutral wire; wherein the first secondary winding is wound on the first core section next to the hot wire, which receives more of the hot wire flux than the neutral wire flux; wherein the second secondary winding is wound on the second core section next to the neutral wire, which receives more of the neutral wire flux than the hot wire flux; and wherein the first and second secondary windings are connected as signal series adding for currents carried by the hot, neutral, or both, which do not involve ground, and signal series opposing for currents carried by either the hot, neutral, or both which involve ground.

According to an embodiment of the invention, a sensor for an arc fault detecting device for protecting an electric power circuit including a neutral wire and a hot wire includes a transformer with the neutral and hot wires forming primaries; a first secondary winding wound next to the hot wire, and arranged to receive more of the hot wire flux than the neutral wire flux; and a second secondary winding wound next to the neutral wire, and arranged to receive more of the neutral wire flux than the hot wire flux; wherein the first and second secondary windings are connected as signal series adding for common mode currents, and signal series opposing for differential mode currents.

According to an embodiment of the invention, an arc fault circuit interrupter for protecting an electric power circuit including a neutral wire and a hot wire includes a core having a first winding next to the hot wire which receives more of the hot wire flux than the neutral wire flux; a second winding next to the neutral wire which receives more of the neutral wire flux than the hot wire flux, wherein the first and second windings are connected as signal series adding for common mode currents, and signal series opposing for differential mode currents.

According to an embodiment of the invention, a combination arc fault and ground fault interrupter for protecting an electric circuit including a neutral wire and a hot wire includes a transformer with the neutral and hot wires forming primaries; a first secondary winding wound next to the hot wire which receives more of the hot wire flux than the neutral wire flux to produce a first signal; a second secondary winding wound next to the hot wire which receives more of the hot wire flux than the neutral wire flux to produce a second signal; an arc fault detector for detection of common mode fault currents from hot to neutral; and a ground fault detector for detection of differential mode fault currents from hot to ground; wherein the arc fault detector detects first and second signals having a predetermined phase relationship and the ground fault detector detects first and second signals that oppose the predetermined phase relationship.

According to an embodiment of the invention, a combination arc fault and ground fault interrupter for protecting an electric circuit including a neutral wire and a hot wire includes a transformer with the neutral and hot wires forming primaries; a center tapped secondary winding wound symmetrically with respect to the neutral and hot wires, with the center tap thus forming two secondary winding segments; an arc fault detector coupled to receive signals from the center tap; a ground fault detector coupled to receive signals from the entire secondary winding; wherein the ground fault detector detects differential mode fault currents from hot to ground and the arc fault detector detects common mode faults from hot to neutral.

According to an embodiment of the invention, a sensor for an arc fault detecting device for protecting an electric power circuit including a neutral wire and a hot wire includes a transformer with the neutral and hot wires forming primaries of said transformer, and a secondary winding of the transformer wound intermediate the hot wire and neutral wire, wherein the secondary winding senses common mode currents carried by the hot wire, the neutral wire, or both wires which do not involve ground but does not sense differential mode currents carried by the hot wire, the neutral wire, or both wires which involve ground.

DETAILED DESCRIPTION OF THE PREFERRED EMBODIMENT

This invention discloses an arc fault current transformer sensor intended for an AFCI (arc fault circuit interrupter) receptacle. AFCI receptacles of this type are primarily designed to sense arc faults in extension cords, and the like, which may have low level arc faults which can be difficult to discern from line and load noise.

This invention describes a current sensor which is sensitive enough to detect low level arc faults while at the same time rejecting non arc related noise from the line and load. Much of the difficulty in sensing low level arc faults, when using a current transformer, comes from requiring the sensitivity to detect the arc fault rate of current change di/dt but without saturating the transformer core from normal load currents. By forming the transformer primary from both the hot and neutral wire, the saturation effect is eliminated as the induced magnetic fields in the core have a cancelling effect on the transformer output signal but arc mimicking noise, coming from either the line or neutral to ground, or both, to ground cause a large signal output from the transformer, as the field caused by these currents causes a field re-enforcement in the transformer core and a large signal output signal which must be rejected.

When an arc fault starts, typically there is a step change in current, or di/dt, followed by broadband arcing noise during the arc. The sensor of this invention responds to both the step and broadband noise of the arc.

Although an AFCI receptacle alone is a useful device, it is desirable to combine an AFCI with a GFCI (ground fault circuit interrupter), since typically both devices are either needed or required to protect a line. The GFCI also adds a strong AFCI feature, which is an ability to detect very low levels of arc faults to ground. This allows simplification of the AFCI arc detector design for response to only arc faults from line to line, or series with the load, type arc faults.

A problem arises when trying to combine an AFCI and GFCI in one current transformer. The GFCI sensor is designed to ignore common mode load currents flowing from line to line, which are equal and opposite, but must respond to line to ground, or neutral to ground, differential mode faults, in which the hot line current differs from the neutral line current by the ground fault current. The AFCI sensor, on the other hand, must respond to line to line and series arc faults which the GFCI sensor ignores. This complicates combining both sensors into one transformer.

While an AFCI can fully function with one sensor transformer, a GFCI requires both a ground fault transformer for receiving a signal and a grounded neutral transformer for transmitting a signal. This invention describes methods to use either of these transformers as a dual function AFCI/GFCI transformer.

In receptacle embodiments of an AFCI/GFCI combination device, it is required to have the hot and neutral wires form equal primaries for the current transformer sensor. This is standard practice for receptacle GFCI's to provide protection even if the line hot and neutral wires are miswired so that the neutral wire becomes hot with respect to ground. This practice is also required of the grounded neutral transmitter transformer, which must transmit a fault current back through the ground fault sensor when either a load neutral-wire-to-ground fault occurs, or in the case of a miswire, a load hot-wire-to-ground fault occurs. In order to construct a shared ground fault/arc fault sensor transformer, or a shared arc fault sensor/grounded neutral transmitter transformer, both transformers typically have hot and neutral wire primaries with equal numbers of turns. When the hot and neutral wires form equal primary windings, the magnetic fields around each tend to cancel the other within the sensor core. Transformer output is much greater for currents from line to ground, when the hot wire field is much greater than the neutral wire field within the sensor, versus the transformer output for currents that flow from the hot wire and return equally and oppositely on the neutral wire wherein the fields within the sensor are equal and opposite. In the case of the AFCI sensor function, this difference in transformer output between line to ground currents versus line to line currents causes the unwanted effect of the current transformer producing larger output signals for currents from line to ground, such as from filters and the like, than line to line signals for the same or greater magnitudes of arc fault current. This can lead to false tripping on small nuisance ground currents. Typically the problem arises in having the same arc signal output that occurs from a load limited series arc fault, where maximum circuit sensitivity is required, as that signal which may be produced by di/dt arc mimicking currents flowing through lumped filter capacitance from line to ground.

To negate this effect, and still have a sensor transformer which can perform one of the GFCI transformer functions, two secondary windings wound on separate sections of the transformer core, with each winding more responsive to one of the primary winding conductors than the other in an asymmetrical way, are connected in series in an asymmetrical way, with each winding wound on a portion of a core next to the hot and neutral wires respectively, in a connective way which allows sensing of the hot and neutral wire fields, when each wire carries an equal and opposite direction current and field within the sensor core, thus producing a sensed signal. Locating the windings in this fashion causes each winding to intercept the respective fields produced from the hot and neutral primary wires in a way which acts to diminish noise current signals from either the hot or neutral lines, or both, to ground, but acts to increase the signal produced by arc fault currents from line to line, and series arc faults caused by a discontinuity in either the hot or neutral wires.

In addition, further noise rejection is preferably accomplished by producing an arc fault signal acceptance bandwidth by forming each winding so that it is self resonant with its parasitic capacitance, or a capacitance connected in parallel with the winding. The resonant frequency can be selected to be above or below, and thereby reject, the frequency range of unwanted noise sources such as power line carriers.

Transformers of this type which have equal turn hot and neutral primaries are also desirable because the normal field cancellation which occurs within the core prevents the core from saturating over a wide range of arc fault currents. By the asymmetrical location of the sensor secondary windings on a portion of the transformer core where one winding receives more flux from one primary versus the other, a sample of each of the hot and neutral fields can be sensed without saturation of the small core of high permeability required for good sensitivity in a small size.

Current transformers with a high permeability capable of producing a large flux density in a small size, but with a low excitation current, are also required to act as grounded neutral transmitters. The type of core which works well in a small arc fault sensor transformer also is the type which works well as a grounded neutral transmitter, and works well as a ground fault sensor, thereby allowing a natural marriage of the two functions.

An arc fault produces high frequency signals in response to a step di/dt change in current at the start of the arc, arc noise di/dt that exists during the arc, and di/dt step change in current at the arc extinguish of the opposite polarity from the start of the arc. In a parallel arc fault, an arc fault occurs between load conductors, with a fault current of typically 75 amps or higher. In a series arc fault, an arc fault occurs within a discontinuity in either the hot wire or neutral wire on the line side of the arc detector, or in the load hot or neutral wires on the downstream side of the arc detector, with a fault current typically 5 amps or higher. Frequency components associated with an arc fault cover a very wide spectrum from the power line frequency up into the GHz range. The sensor of this invention is designed to detect a selected range of broadband arc fault frequencies while discriminating against arc mimicking frequencies.

Figure 1A:
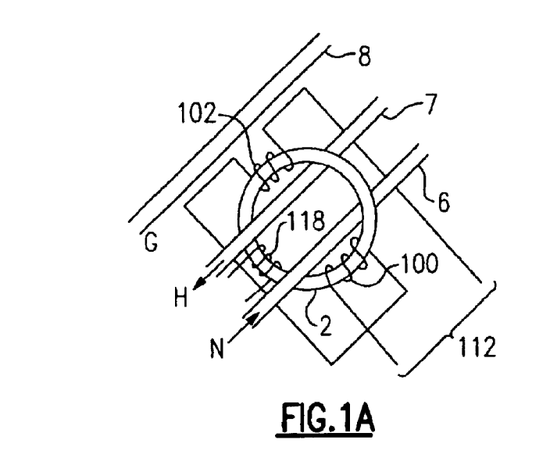
FIG. 1A shows a schematic diagram of a sensor of the present invention with windings connected for ground current noise rejection, but arc fault signal addition, and showing a grounded neutral transmitter winding.

Referring to FIG. 1A, an embodiment of the sensor in which the sensor is a current transformer 1 is illustrated. Transformer 1 includes a physically small toroid shaped core 2, preferably made of ferrite, having an aperture through which two conductors, a hot wire 7 and a neutral wire 6, pass. The two conductors are the primary windings of transformer 1. Core 2 also has a first secondary winding 102, adjacent to hot primary wire 7, and a second secondary winding 100, adjacent to neutral wire 6. Windings 100 and 102 are positioned on core 2 so that first winding 102 receives more of the flux from hot wire 7, while second winding 100 receives more of the flux from neutral wire 6.

Figure 1B:
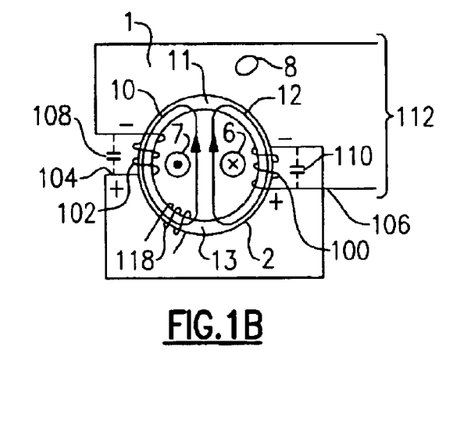
FIG. 1B shows a schematic diagram of the cross-section of FIG. 1A.

FIG. 1B shows a cross section of FIG. 1A with the 'dot' in hot wire 7 showing current out of the drawing and the 'cross' in neutral wire 6 showing current into the drawing for one half cycle of line current, with both 'dot' and 'cross' reversing during the next half cycle. Field lines 10 and 12 show the magnetic field lines set up by the current in hot 7 and neutral 6 wires respectively. When field lines 10 and 12 are in opposite directions in the same plane and of the same approximate magnitude and phase, the lines interfere and do not cross. This action causes field interference between wires 6 and 7, causing the majority of field 10 to divert into the core, generally at 11, and pass through winding 102 and back out again, generally at 13 as shown. Similarly field 12, around neutral wire 6, does the same action through winding 100. In this mode, core 2 behaves as if it were split at points 11 and 13 where field lines 10 and 12 enter and leave the core. When the windings are wound as shown, field 10 produces a positive voltage at an end 104 of winding 102, while field 12 produces a positive voltage on an end 106 of winding 100. Connecting windings 100 and 102 together as shown produces signal addition.

Also shown are parasitic winding capacitances 108 and 110 across windings 102 and 100, respectively, forming resonate circuits with the windings. At a predetermined frequency, determined by the winding inductances of winding 100 and 102 along with parasitic winding capacitances 110 and 108, respectively, both of the resonant circuits resonate and cause a Q rise in voltage across each winding 102 and 100. Because the circuits are series connected, the voltages add, thereby producing a large signal across output 112. This voltage rise can be large enough to negate the need for a signal amplifier. Inductance windings 100 and 102, in this mode, behave as if core 2 was split as described above.

The resonant point of both winding tanks can be selected so that the circuits resonate at a frequency band above the power line carrier band, which extends from about 9 KHz to 400 KHz, above the significant 60 Hz line frequency harmonics, and the frequencies generated by power line inverter harmonic type noise and the like. The resonant circuits reject or reduce signal from these and like sources. An external capacitance may be connected across each winding 102 and 100, or across the series connected windings, to lower the resonant frequency point. In addition, a resistance may be added across each secondary winding 102 and 100 to lower the circuit Q and increase the response bandwidth.

The resonant bandwidth may be placed in the AM radio band where powerful local signal sources, such as from mobile or hand held transmitters, are prohibited, which therefore do not cause false signals from the sensor. The winding variables, or the external capacitance value, can be different for the winding 100 and winding 102 circuit, producing different resonant frequencies which can be set to produced a double tuned effect, producing a bandwidth selected for arc fault noise. In the preferred embodiment, the sensor has the resonant frequency set by an external capacitor, placed across the series connected windings, which selects for the lowest possible resonant frequency which produces acceptable detection of arc fault di/dt while rejecting inverter type switching noise. Additional analog and software processing are used to reject power line carrier transmissions.

Figure 1C:
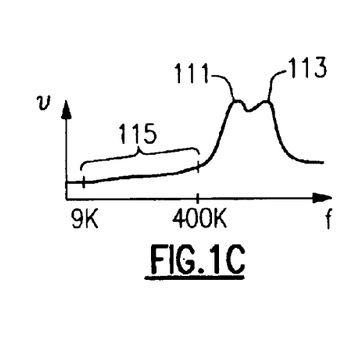
FIG. 1C shows the voltage response across output 112 of FIG. 1B.

Referring to FIG. 1C, the voltage response across output 112 is shown, in which the double tuned effect is shown where one winding circuit resonates at a frequency 111 and the other at 113, producing an arc noise acceptance bandwidth, but rejecting the power line carrier band 115 and the noise harmonics mentioned above.

Figure 1D:
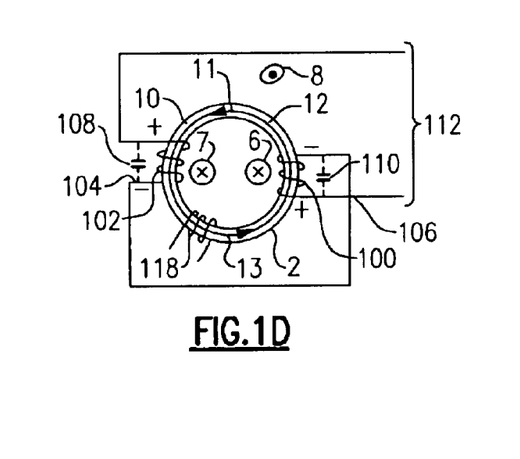
FIG. 1D shows a schematic diagram used in explaining the operation of the sensor of the present invention.

Referring to FIG. 1D, the effect of ground mode noise currents moving down both the hot 7 and neutral 6 wires is shown, with both shown as hot 'cross' marked, and with ground 8 shown as 'dot' marked. In this mode, field 10 has reversed direction with respect to the same field 10 shown in FIG. 1B, causing a reversal of voltage across winding 102, which, when added to the equal and opposite voltage across winding 100, causes a minimum voltage at the output terminals 112. This shows how the sensor rejects noise which is common to both the hot 7 and neutral 6 wires. In this mode fields tend to cancel between the hot 7 and neutral 6 wires, causing one circulating clockwise flux in the core 2, but which still causes voltage cancellation at the output 112.

Figure 1E:
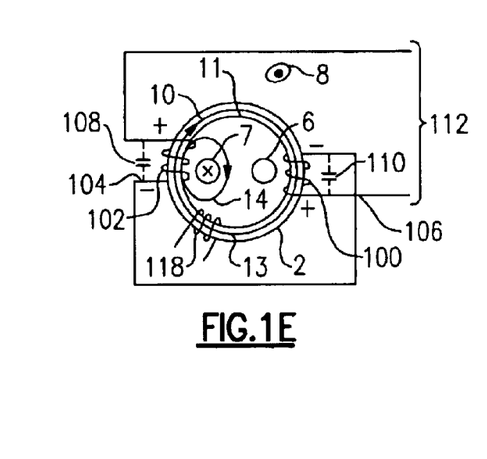
FIG. 1E shows a schematic diagram used in explaining the operation of the sensor of the present invention.

Referring to FIG. 1E, the effect of noise currents moving from the hot 'cross' marked wire 7 to the 'dot' marked ground wire 8 is shown. In this mode there is no breaking out of field lines from core 2 at points 11 and 13, except for some leakage flux 14. Most of the flux 10 from wire 7 passes through windings 100 and 102, but once again the voltages are series opposing at output 112 with a commensurate reduction in output voltage. In this mode, there is no air gap encountered by the field lines 10, as happens in FIG. 1B where the field lines must break out of the core and traverse the air gap between the hot 7 and neutral 6 wires. Field line 10 produces a large magnetic flux in the core 2 by acting on the core's magnetic domains without encountering an effective air gap. The much larger flux in core 2 produces a much larger voltage across windings 100 and 102, which being out of phase, once again tends to cancel at output 112. This larger voltage cancellation leaves a significant error voltage from incomplete cancellation and the leakage flux 14. By careful core selection and winding parameters, this error voltage can be made large enough during arc fault events from hot wire 7 to ground wire 8 to produce enough signal output for arc fault detection, and producing a similar sensor output for a series arc fault current which returns via ground wire 8 as for a series arc fault current which returns via neutral wire 6.

In the case of a combined arc fault sensor and ground fault sensor or grounded neutral transmitter, a third winding 118 is added anywhere on core 2, or one of the sensor windings 102 or 100 could serve the dual function.

Figure 2A:
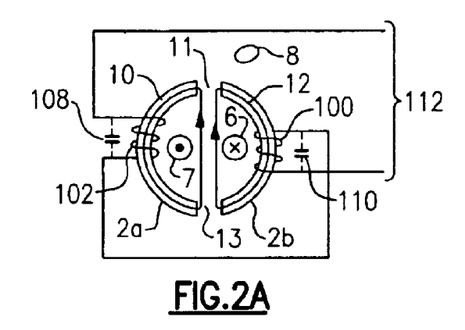
FIG. 2A shows a schematic diagram showing the sensor of FIG. 1A, but with a split core.
Figure 2B:
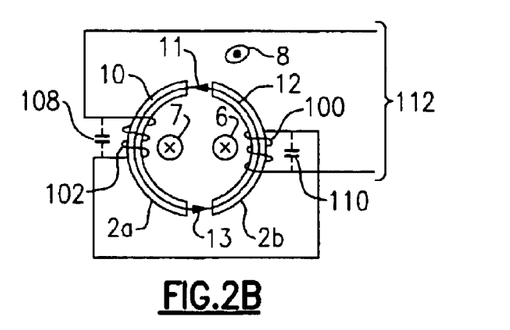
FIG. 2B shows a schematic diagram used in showing the operation of the sensor of FIG. 2A.
Figure 2C:
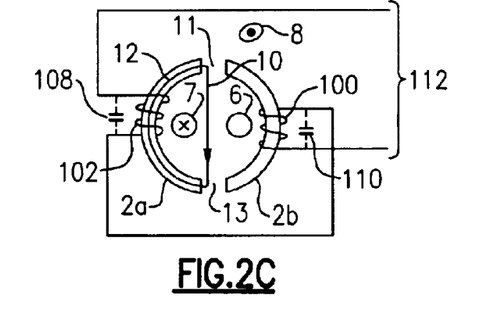
FIG. 2C shows a schematic diagram used in showing the operation of the sensor of FIG. 2A.
Figure 2D:
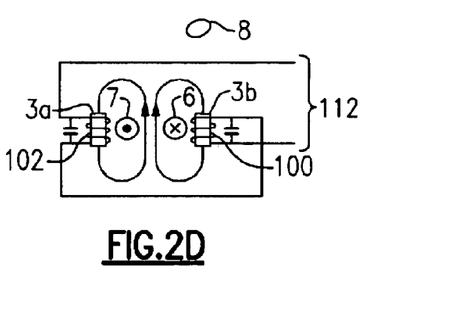
FIG. 2D shows a schematic diagram of an alternative embodiment to the split core embodiment of FIG. 2A.

Referring to FIGS. 2A–2D, core 2 is shown split into two parts 2a and 2b at the points where the field lines 10 and 12 would enter and exit an unsplit core. The action of fields 10 and 12 in the split core in FIG. 2A behave similarly to the fields 10 and 12 shown in FIG. 1A. Likewise, field lines 10 and 12 in FIG. 2B behave similarly to the field lines 10 and 12 in FIG. 1D. The major advantage of the split core is a much-reduced winding cost. FIG. 2C shows where the split core field action deviates from the solid core 2 shown in FIG. 1E. In FIG. 2C the field line 10 does not circulate around the entire core 2a and 2b but predominately through core part 2a because of the introduced air gap. This causes more output voltage across winding 102 than winding 100, and an increased output voltage at 112, which action is not as effective at rejection of noise currents from hot wire 7 to ground wire 8. Nevertheless, by holding the two core parts 2a and 2b together and reducing the air gap between the pieces, the split core behaves closer in action to that of the solid core in this mode. The action of the self-resonance of windings 100 and 102 resonating with each parasitic winding capacitance acts in the same way as the solid core shown in FIG. 1A. FIG. 2D shows a logical extension of the split core where two bar cores 3 and 4 take the place of split core parts 2a and 2b, respectively.

Figure 3A:
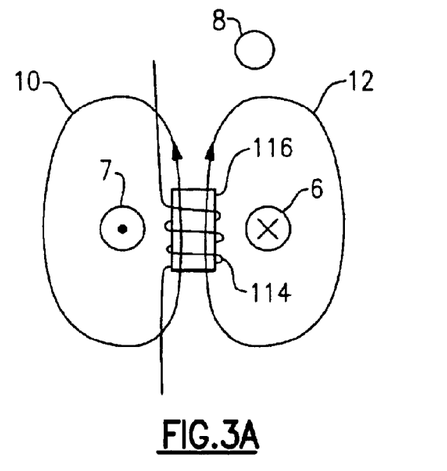
FIG. 3A shows a schematic diagram of an alternate embodiment of ground current noise rejection, but arc fault noise signal addition, showing a bar core sensor positioned between the line and neutral wires.

Referring to FIG. 3A, yet another embodiment of a current sensor is shown which includes a ferrite bar core 116 and a winding 114, which is oriented between the hot 7 and 6 neutral wires in a position to receive both the flux 10 and 12 generated by the hot 7 and neutral 6 wires, respectively. Field line 10, from 'dot' marked hot wire 7, and field line 12, from 'cross' marked neutral wire 6, are shown in the field orientation which occurs when a line to line arc fault or a series arc fault occurs as previously explained. In this mode, fields 10 and 12 are in the same direction through bar core 116 and produce signal adding.

Figure 3B:
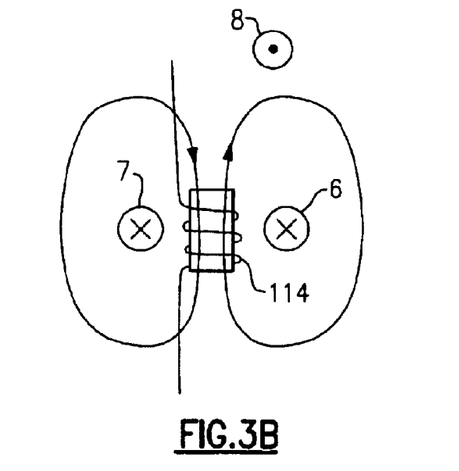
FIG. 3B shows a schematic diagram used in explaining the operation of the sensor of FIG. 3A.

Referring to FIG. 3B, field lines 10 and 12 are shown for noise currents to ground 8. Field lines 10 and 12 cause cancellation in core 116 and winding 114, reducing the output of the sensor for this unwanted noise pickup.

Figures 3C, 3D:
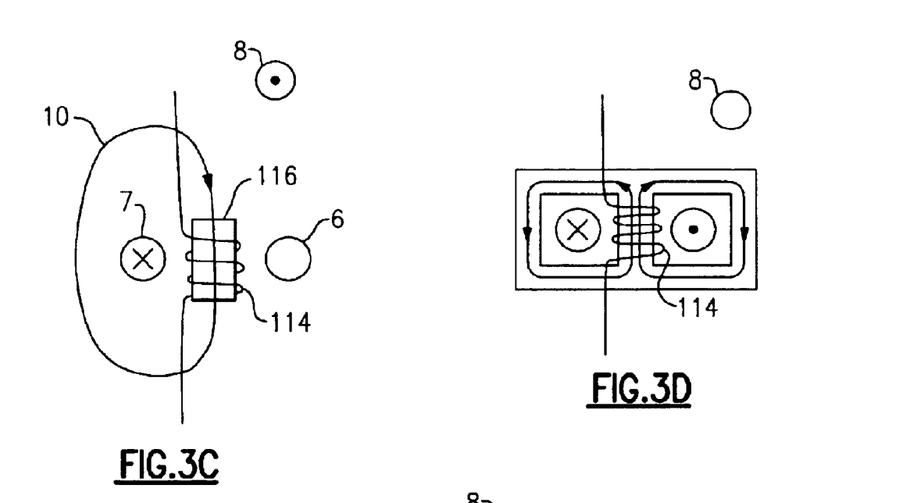
FIG. 3C shows a schematic diagram used in explaining the operation of the sensor of FIG. 3A.
FIG. 3D shows a schematic diagram of an alternate embodiment of the sensor of FIG. 3A, but with a solid figure eight type core.

Referring to FIG. 3C, the case of a current flowing from hot 7 to ground 8 is shown. In this mode only field 10 from hot wire 7 cuts core 116, as no current flows through neutral 6, and the output is one half that of the output for the case shown in FIG. 3A. This still gives some signal reduction for this unwanted pickup mode, but does not give the good reduction as is produced by the FIG. 1E sensor.

Figure 3E:
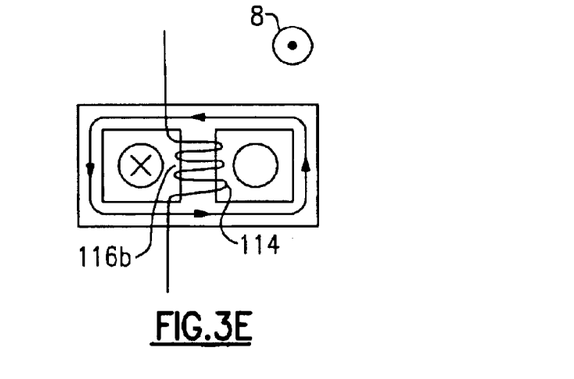
FIG. 3E shows a schematic diagram of an alternate embodiment of the sensor of FIG. 3D, but with a solid figure eight type core having an air gap in the center leg.

Referring to FIG. 3D, a modification of the core where winding 116 is still located in between hot 7 and neutral 6 wires is shown, but on a solid figure eight type core, but which may be a gapped 'E' type core which surrounds both wires without an air gap. This configuration behaves the same as explained in FIGS. 3A–3C but gives a larger signal output since the field lines 10 and 12 do not encounter an air gap. When the sensor is used as a dual function arc fault sensor and grounded neutral transmitter, either a second winding is added in the same location as winding 114, or winding 114 serves both purposes. In FIG. 3E a further modification of FIG. 3D is introduced wherein an air gap 116b is placed in a center leg 116a. For common mode currents, the fields 10 and 12 reinforce within center leg 116a, but for a differential mode current, as shown by a current flowing into the cross marked hot wire 7 and out of the dot marked ground wire 8, the field flux flows around the lower reluctance perimeter path of core 116, bypassing the center leg 116a path containing the higher reluctance air gap 116b. In this way, common mode fields reinforce within winding 114 whereas differential mode fields bypass winding 114. In addition, the core of FIG. 3D behaves in the same manner as the core of FIG. 1B by responding to common mode currents but rejecting differential mode currents.

Figure 4:
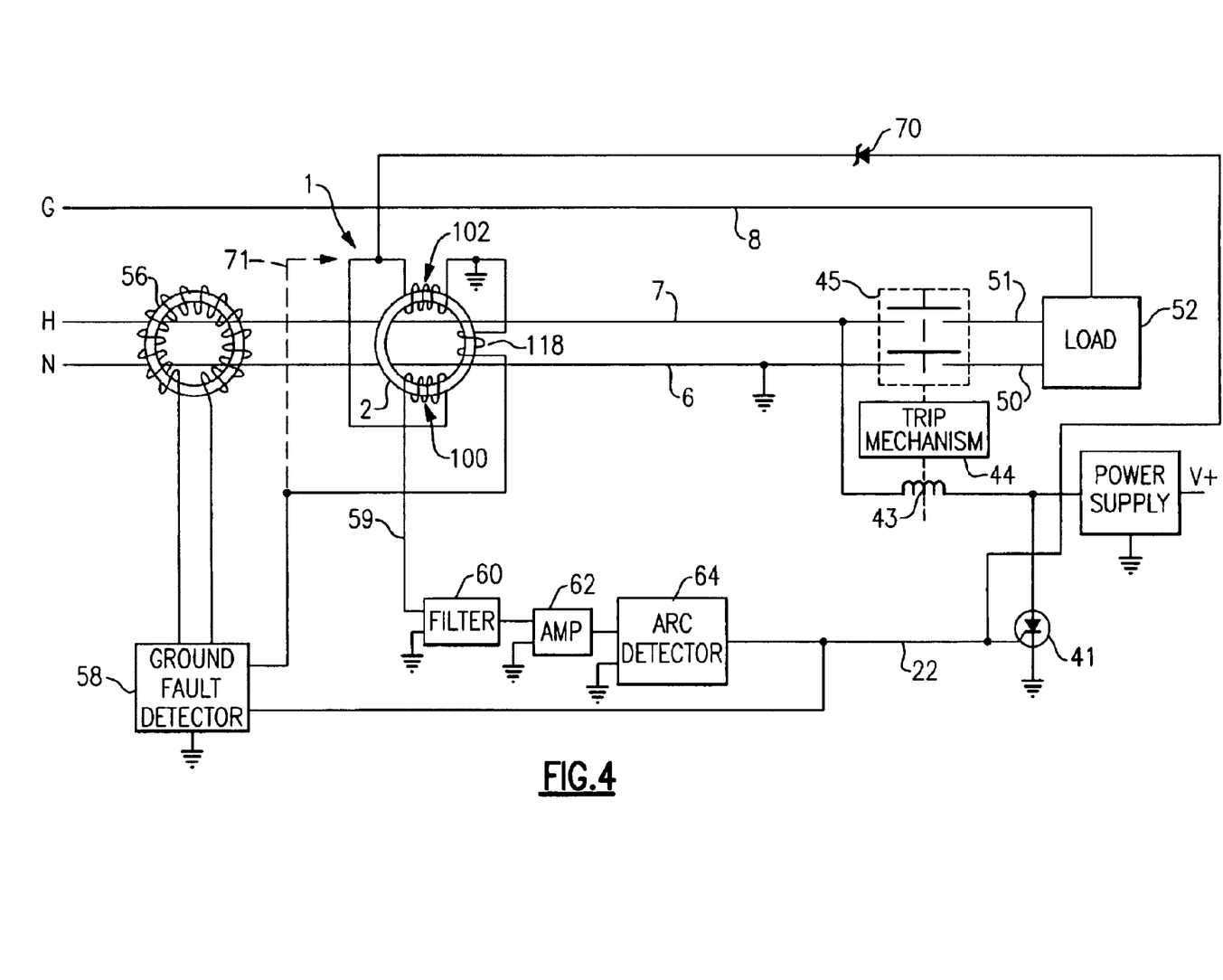
FIG. 4 shows a schematic diagram of how a sensor according to an embodiment of the invention connects to arc and ground fault detectors operating a circuit interrupter.

FIG. 4 shows how the sensors described above couple to a combination AFCI/GFCI. The AFCI shown is formed from small inexpensive components that can be easily integrated into an electrical receptacle, plug, or in-line device. The circuit is designed to be manufactured in the same form as the ground fault circuit interrupter devices shown in U.S. Pat. Nos. 5,594,358 and 5,510,760 for example.

The arc fault circuit interrupter protects an electrical circuit which includes at least a neutral conductor 6 and a line conductor 7. When a ground 8 is also present, the arc fault circuit interrupter of FIG. 4 detects arcs occurring between the line conductor and ground, the neutral conductor and ground, the line and neutral conductors, or a series discontinuity. The arc fault circuit interrupter may also detect power line frequency faults occurring between the line conductor and ground.

A circuit interrupter 45 is connected in series with the power line, i.e., neutral and hot conductors 6, 7, between the power source (not shown) and a load 52. A contactor or similar device may be employed which includes a first set of contacts connected to neutral conductor 6 and to load 52 by way of a conductor 50, and a second set of contacts connected to line conductor 7 and to load 52 by a conductor 51. The first and second contacts are preferably spring loaded by a mouse trap type arrangement, and are controlled by a trip mechanism 44. When trip mechanism 44 is activated, the spring-loaded contacts are opened and latch in an open condition until they are manually reset. A device of this type is well known, and is shown, for example, in U.S. Pat. No. 5,510,760.

An output 59 of sensor 1, shown here as the embodiment described in FIGS. 1A–1E with one end of winding 102 held at circuit reference, is coupled to a filter 60 which further removes the fundamental 60 Hz line signal. Filter 60 also removes the type of noise created by power supply inverters by including a high pass filter. Filter 60 may also include a bandpass filter which compensates for the roll off in the frequency response of the sensor when the winding circuits resonate, as described in FIG. 1A, to produce a broader band of arc fault noise response. The filtered signal is amplified by an optional amplifier 62, and then applied to an arc detector 64. Arc detector 64 detects predetermined arc fault signatures in the signal arriving at the input to the detector 64, outputting a gate signal 22 to an SCR 41 when a legitimate arc fault signature is recognized. A bypass circuit around arc detector block 64, which is operated by ground faults, is driven by the potential developed across winding 102 during large current ground faults. These ground faults cause large voltage saturation pulses across winding 102, as core 2 goes in and out of saturation. The saturation voltage breaks over a Zener 70 whose cathode is connected to one end of winding 102 and whose anode connects directly to the gate of SCR 41. In this way, arcing faults activate SCR 41 via arc detector 64, while large current ground faults of a predetermined value activate SCR 41 directly via Zener 70. All AFCI circuitry described above constitutes a stand alone AFCI which is independent of GFCI sensor 56 and ground fault detector 58.

With the addition of ground fault sensor 56 and ground fault detector 58, which operation is well known in the prior art, the combination device detects ground faults. The GFCI negates the need for the ground fault bypass path through Zener 70, since the ground fault sensor/detector 56, 58 duplicates this function. However, the function of sensing a grounded neutral for the GFCI function requires a grounded neutral transmitter which transmits a current through GFCI sensor 56 when the load neutral is coupled to ground. The design of sensor 1 allows for the addition of winding 118 which causes core 2 to perform the additional function of a grounded neutral transmitter. A connection 71 shows an alternate connection in which winding 102 performs the dual functions of an arc fault sensor and a grounded neutral transmitter.

Figure 5:
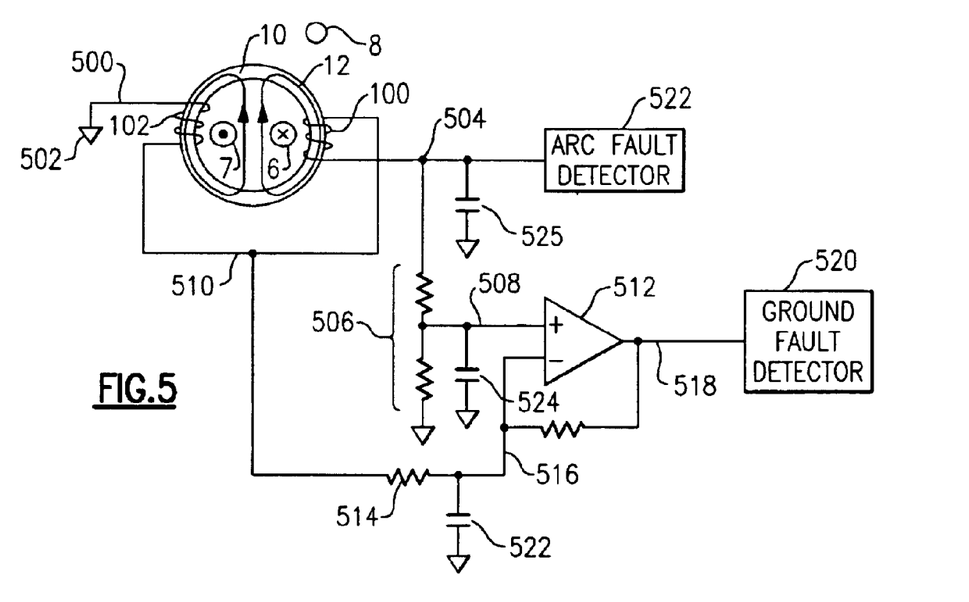
FIG. 5 shows a schematic diagram of how a sensor of an embodiment of the present invention connects to arc and ground fault detectors operating a circuit interrupter.

Referring to FIG. 5, an enhanced method of ground fault detection is shown that performs better than the embodiment of FIG. 4. In this embodiment, one end 500 of winding 102 is connected to circuit common 502 as before. In common mode operation when the current in both the hot 7 and neutral 6 wires causes substantially equal fields 10 and 12 respectively, the signal produced by the fields 10 and 12 are additive as explained above. If the windings have the same turns, and are mounted opposite each other on a symmetrical core so that winding 102 has the same relationship to primary 7 as does winding 100 to primary 6, the output voltage at end 504 of winding 100 is double that of the voltage across winding 102 and of the same phase for common mode currents. If the output voltage from the series connected windings at end 504 is applied across halving voltage divider 506, which is connected as the input to the non-inverting input 508 of inverting amp 512, then the divided voltage is at the same voltage level and phase as the voltage level and phase across winding 102, which is acting as the voltage input to the inverting input 516 of inverting amp 512.

For common mode currents, which include normal load currents, inrush currents, and also arc fault di/dt currents from line to line, both the inverting and non-inverting input voltages at 508 and 516 respectively are substantially the same and cause little or no signal output from inverting. amp 512. When a differential mode ground fault occurs, the substantially equal and opposite voltages across windings 102 and 100, and connected in series, tend to series cancel as described above causing the voltage across winding 102 to rise with respect to the series output voltage at end 504. Therefore, the voltage at non-inverting input 508 is small compared to non-inverting input 516, causing a detectable signal output 518 which is applied to a ground fault detector 520. This configuration allows low level ground fault sensing without responding to large common mode load and inrush currents. In this way the two winding sensor can perform the dual function of arc fault sensing and low level ground fault sensing. The circuit has additional capacitors 524 and 522 which act as low pass filters for rejecting di/dt when working against filter element resistors divider 506 and resistor 514 respectively, thus blocking false detection to large di/dt pulses. A capacitor 525 connected across the sensor output sets the resonant frequency as described above.

Figure 6:
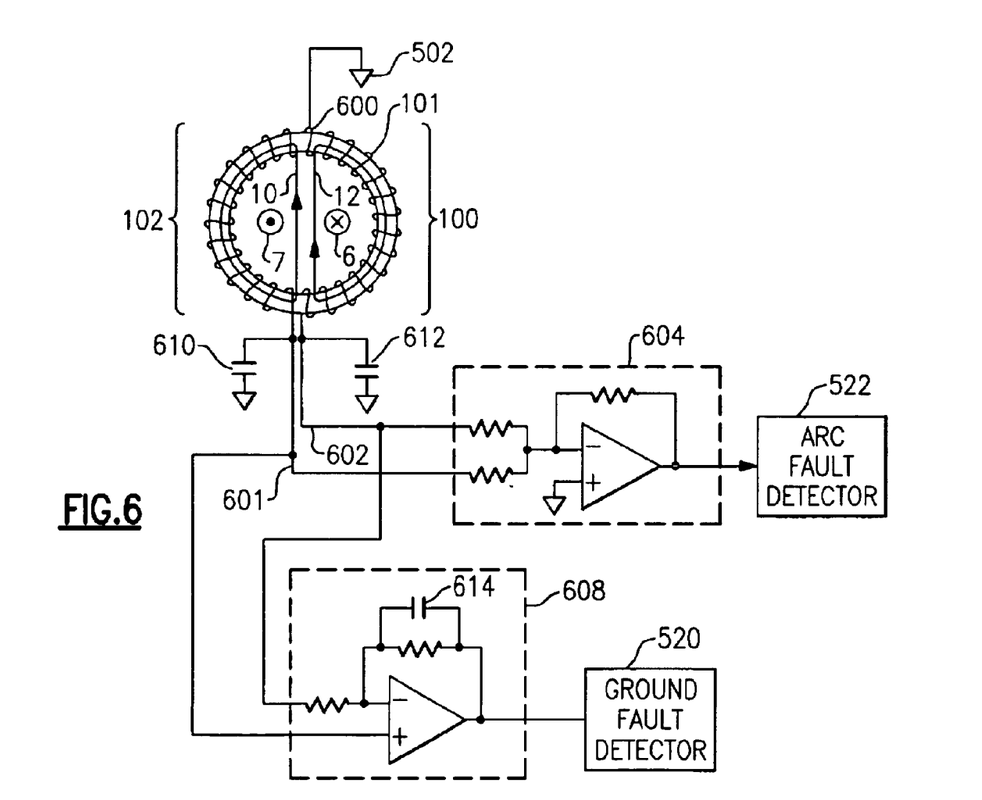
FIG. 6 shows a schematic diagram of an embodiment of the invention in which the sensor has a center-tapped winding, but provides the same function as the embodiment of FIG. 5.

Referring to FIG. 6, an alternate way of producing the two winding sensor with ground fault detection is shown. In this configuration the transformer core has a symmetrical winding 101, as is used for ground fault detection, but with a center tap 600 for producing two windings 102 and 100, located to receive flux lines 10 and 12 respectively in a substantially equal way as in FIG. 1B and FIG. 5, which outputs can be configured to produce the same effect as the two asymmetrical windings described in FIG. 1B. During a differential mode ground fault, the voltages across winding segments 102 and 100, caused by the differential field around primaries 7 and 6 respectively, are additive and produce a ground fault signal output at a winding end 602 with respect to a winding end 601 as is well known in the prior art of ground fault detectors.

During the common mode sensing of arc fault signals, which occur from line to line, the voltages at winding ends 601 and 602 are in phase as referenced to common connected center tap 600 and taken across windings 102 and 100. The output voltages at 600 and 602 are summed in a summer amplifier 604 which is also referenced to circuit common 502, so that for common mode arc fault di/dt, the signals are additive and for differential mode ground acting di/dt, the signals are subtractive. In this way, and with equal turns in winding segments 102 and 100 and uniform core geometry, common mode di/dt add and differential mode di/dt subtract, producing the same effect as FIG. 1B. Summer amp 604 drives arc fault detector block 522. For differential current sensing, winding ends 602 and 600 are provided as inputs to an amplifier 608, configured as a differential amplifier, which amplifier responds to differential ground fault currents while rejecting common mode currents, as is well known in the prior art of ground fault detectors. Amplifier 608 drives a ground fault detector block 520. Capacitors 610 and 612 set the resonant frequency across windings 102 and 100 respectively and preferably are equal. A capacitor 614 acts as an integrator capacitor for filtering di/dt from the ground fault detector amp 608. Summer amp 604 is selected for a high gain-bandwidth while 608 can be a low gain-bandwidth amplifier. In this way a current sensor wound for optimum ground fault detection can also be used for arc fault detection.

Figure 7:
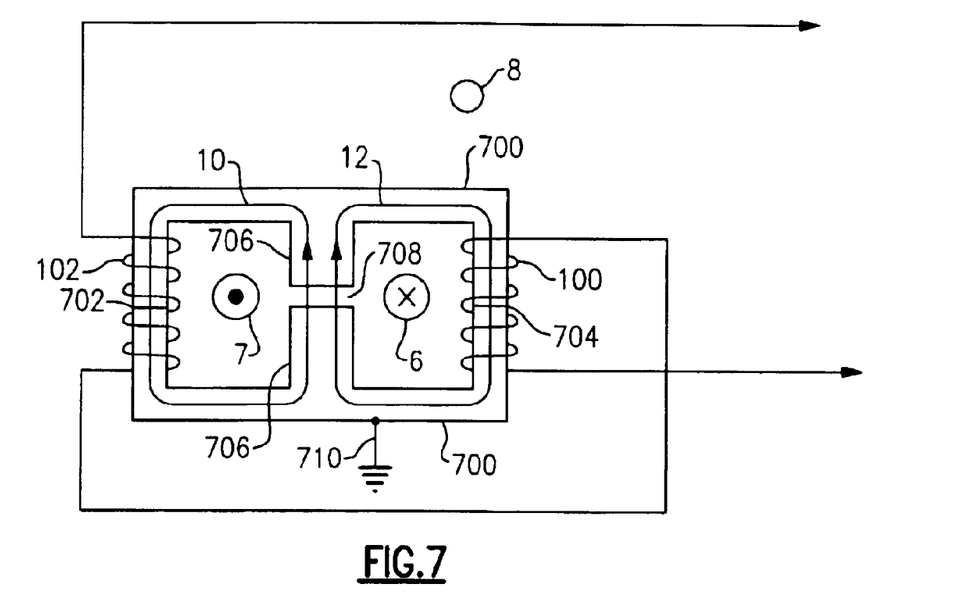
FIG. 7 shows a schematic diagram of an embodiment similar to FIG. 1B but constructed of two butt joined 'E' cores.

Referring to FIG. 7, a further embodiment of the two winding sensor similar to the embodiment of FIG. 1B is shown, with like items like numbered, but with the toroid core of FIG. 1B replaced by two mating "E" cores 700, in which the outer arms butt join at 702 and 704 and with the butted arms wrapped by secondary windings 102 and 100 respectively, which windings are connected in series for common mode acceptance but differential mode rejection as in FIG. 1B. Center legs 706 of each "E" core 700, preferably identical, are shorter than the outer arms to form an air gap 708. Air gap 708 prevents the field flux lines 10 and 12 originating from primary winding conductors 7 and 6, respectively, from saturating any part of cores 700 for a predetermined level of primary current. This allows a much greater core flux as opposed to the toroid case of FIG. 1B, when excited by the same primary flux, because of the much smaller air gap that the field lines 10 and 12 encounter when passing between primary winding conductors 7 and 6, through legs 706 and gap 708. This allows a much greater sensitivity to primary winding di/dt as opposed to the toroid case of FIG. 1B. Windings 102 and 100 are connected in series adding for common mode primary currents in the same way as in FIG. 1B. Cores 700 preferably have a ground connection 710 in both this embodiment and also for all the above embodiments in order to limit the sensor transformer response to electric field coupling. Cores 700 could be replaced with a single core molded or formed in the same basic shape as the two mating 'E' cores with an air gap in the center leg. Using two "E" cores allows windings 102 and 100 to be pre-wound on bobbins which can be slipped over the outer "E" core legs, which is a less expensive method of installing the windings than other methods.

Figure 8:
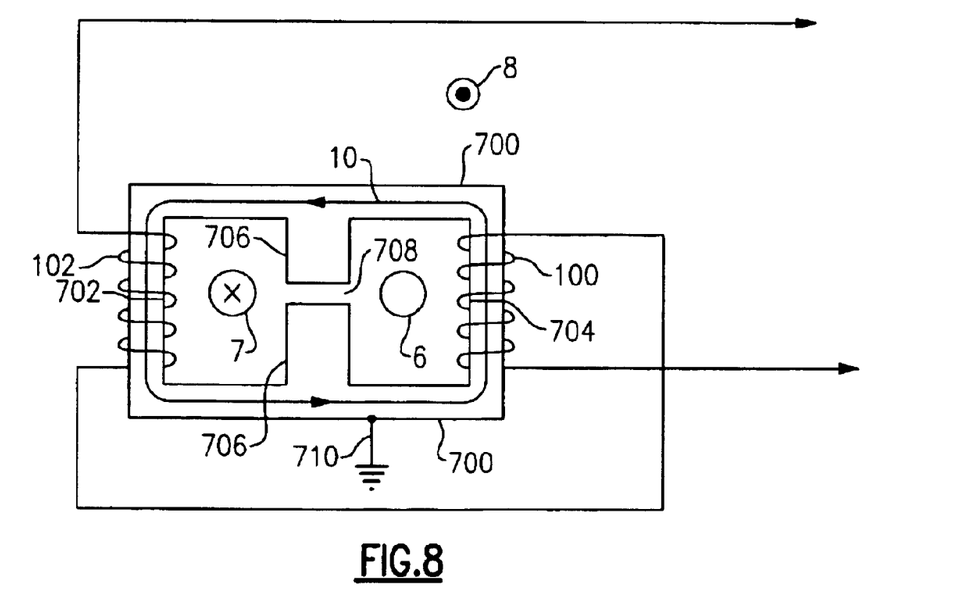
FIG. 8 shows the reverse side of the embodiment of FIG. 7.

Referring to FIG. 8, the action for a differential primary current is shown with action similar to that of FIG. 1E in which flux 10 circulates around the perimeter of the "E" cores causing cancellation of the signal at 112 (FIG. 1E).

Preferably each core of each current sensor in all the above embodiments is grounded, or connected to circuit common, to prevent the susceptibility to electric field coupling. This can be accomplished through a solid contact, friction contact, conductive coatings, bare wire wraps, etc., to circuit common or ground.

It will be understood by those skilled in the art that sensor 1 shown in FIG. 4 could have as substitutions sensors shown and described in FIGS. 2A–2D, and FIGS. 3A–3D. It will also be understood that AFCI sensor windings 102 and 100 could have been wound on GFCI transformer 56 causing that transformer 56 to perform the dual functions of arc fault detection and ground fault detection. Although all the primary windings of the sensors in FIGS. 1A–3D show one turn primaries, each primary winding could be multiturn.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. A sensor for an arc fault detecting device for protecting an electric power circuit including a neutral wire and a hot wire, comprising:
   a transformer with the neutral and hot wires forming primaries;
   a first secondary winding wound next to the hot wire, and arranged to receive more of the hot wire flux than the neutral wire flux; and
   a second secondary winding wound next to the neutral wire, and arranged to receive more of the neutral wire flux than the hot wire flux;
   wherein the first and second secondary windings are connected as signal series adding for common mode currents, and signal series opposing for differential mode currents.

2. The sensor of claim 1, in which the transformer includes a core, wherein said core has a coupling to enable electrical connection to circuit common to eliminate sensitivity to electric field noise.

3. The sensor of claim 1 in which each of the first and second secondary windings self resonate with respective winding parasitic capacitance at predetermined first and second frequencies.

4. The sensor of claim 3 in which the first and second frequencies overlap into double tuned circuits and act to produce increased signal output over selected broad bandwidths of arcing noise.

5. The sensor of claim 3 in which the first and second frequencies are each above 400 KHz.

6. The sensor of claim 3 further comprising an additional capacitor connected across each secondary winding.

7. The sensor of claim 3 further comprising an additional resistor connected across each secondary winding whereby the circuit Q is lowered, thereby increasing the sensor bandwidth.

8. The sensor of claim 1 in which the transformer comprises a core having at least one air gap, said air gap lying along a line that is perpendicular to a line which bisects the cross-sections of the hot and neutral wires.

9. The sensor of claim 8 in which the core comprises a toroid.

10. The sensor of claim 8 in which the core comprises a square.

11. The sensor of claim 8, in which the transformer includes:
  a core having a continuous perimeter portion surrounding said neutral and hot wires; and
  a leg portion located along a line that is perpendicular to a line which bisects the cross-sections of the hot and neutral wires;
  wherein said leg portion has an air gap; and
  wherein said first and second windings are wound on said continuous perimeter portion.

12. The sensor of claim 8, in which the transformer includes two E cores, wherein the outer legs of the E cores abut each other but the center legs do not abut each other so as to form an air gap, and wherein the first winding surrounds one abutted pair of outer legs and the second secondary winding surrounds the other abutted pair of outer legs.

13. The arc fault circuit interrupter of claim 1 in which each of the first and second secondary windings self resonates with its respective winding parasitic capacitance at a predetermined frequency.

14. The arc fault circuit interrupter of claim 1 where the resonant tank frequencies overlap into double tuned circuits and act to produce increased signal output over a selected broad bandwidth of the arcing noise.

15. The arc fault circuit interrupter of claim 1 in which each secondary resonates at a frequency above 400 KHz.

16. The arc fault circuit interrupter of claim 1 further comprising an additional capacitance connected across each secondary winding.

17. The art fault circuit interrupter of claim 1 further comprising an additional resistor connected across each secondary winding whereby the circuit Q is lowered thereby increasing the sensor bandwidth.

18. The arc fault circuit interrupter of claim 1 in which the core comprises a bar core.

19. The arc fault circuit interrupter of claim 1 in which the core comprises a ferrite core.

20. The sensor of claim 1, in which the transformer comprises a bar core, in which the bar core is located between the neutral and the hot conductor in a position to receive the flux from both wires, and in which the flux from each wire reinforces for a common mode current but decreases for differential load current, and in which the transformer comprises a first secondary acting as the sensor winding and one or more additional secondary windings connected as resonate tanks which resonate in the broadband arc noise spectrum and which act to increase the flux passing through the sensor secondary.

21. The sensor of claim 20 in which the first secondary also resonates in the broadband arc noise spectrum.

22. The sensor of claim 20 in which each secondary winding self resonates with its respective winding parasitic capacitance at a predetermined frequency.

23. The sensor of claim 20, where the resonate tank frequencies of the secondary windings overlap into double or N tuned circuits and act to produce increased signal output over selected broad bandwidths of the arcing noise.

24. The sensor of claim 20 in which each secondary resonates at a frequency above 400 KHz.

25. The sensor of claim 20 further comprising an additional capacitance added across each secondary winding.

26. The arc fault detecting device of claim 1, further comprising:
  an electronic switch which activates a circuit interrupter; and
  a Zener diode directly coupling one or more of the sensor windings to the electronic switch; wherein the Zener diode is characterized by a breakover voltage selected at a predetermined level so as to allow the sensor output signal to directly trigger the electronic switch during large fault currents.

27. The arc fault detecting device of claim 1, further comprising a ground fault detector, wherein the sensor transformer first or second windings, or both, act as a grounded neutral transformer transmitter.

28. The arc fault detecting device of claim 27 in which a third winding acts as the grounded neutral transformer transmitter.

29. The arc fault detecting device of claim 27 in which a third winding acts as a ground fault transformer sensor.

30. An arc fault circuit interrupter for protecting an electric power circuit including a neutral wire and a hot wire, comprising:
  a core having a first winding next to the hot wire which receives more of the hot wire flux than the neutral wire flux;
  a second winding next to the neutral wire which receives more of the neutral wire flux that the hot wire flux,
  wherein the first and second windings are connected as signal series adding for common mode currents, and signal series opposing for differential mode currents.

31. The arc fault circuit interrupter device of claim 30, further comprising:
  an electronic switch which activates a circuit interrupter; and
  a Zener diode directly coupling one or more of the sensor windings to the electronic switch;
  in which the Zener diode is characterized by a breakover voltage selected at a predetermined level so as to allow the sensor output signal to directly trigger the electronic switch during large fault currents.

32. A combination arc fault and ground fault interrupter for protecting an electric circuit including a neutral wire and a hot wire, comprising:

a transformer with the neutral and hot wires forming primaries;

a first secondary winding wound next to the hot wire which receives more of the hot wire flux than the neutral wire flux to produce a first signal;

a second secondary winding wound next to the hot wire which receives more of the hot wire flux than the neutral wire flux to produce a second signal;

an arc fault detector for detection of common mode fault currents from hot to neutral; and a ground fault detector for detection of differential mode fault currents from hot to ground;

wherein the arc fault detector detects first and second signals having a predetermined phase relationship and the ground fault detector detects first and second signals whose phases oppose the predetermined phase relationship.

33. The combination arc fault and ground fault circuit interrupter of claim 32, further comprising an inverting amplifier that prevents signal from common mode fault currents from being coupled to the ground fault detector.

34. The combination arc fault and ground fault circuit interrupter of claim 32, wherein differential mode fault currents greater than 5 milliamperes are detected.

35. The combination arc fault and ground fault circuit interrupter of claim 32, further comprising at least one low pass filter coupled between at least one of said first and second windings and said ground fault detector wherein detection of di/dt signal by the ground fault detector is prevented.

36. The combination arc fault and ground fault circuit interrupter of claim 32, further comprising a capacitor coupled to at least one of said first and second windings to establish a resonant frequency.

37. The combination arc fault and ground fault circuit interrupter of claim 32, further comprising an inverting amplifier having first and second input terminals and an output terminal;

wherein said first and second input terminals receive either two of said first signal, two of said second signal, or first and second signals coupled in series, and the output terminal is coupled to the ground fault detector.

38. The combination arc fault and ground fault circuit interrupter of claim 32, wherein said arc fault detector is coupled to the first and second coils coupled in series.

39. A combination arc fault and ground fault interrupter for protecting an electric circuit including a neutral wire and a hot wire, comprising:

a transformer with the neutral and hot wires forming primaries of said transformer;

a center tapped secondary winding wound symmetrically with respect to the neutral and hot wires, with the center tap thus forming two secondary winding segments of said transformer;

an arc fault detector coupled to receive signals from at least one of the secondary winding segments; and a ground fault detector coupled to receive signals from the entire secondary winding;

wherein the ground fault detector detects differential mode fault currents from hot to ground and the arc fault detector detects common mode faults from hot to neutral.

40. The combination arc fault and ground fault interrupter of claim 39, further comprising a summer coupled to the secondary winding segments to produce a signal from common mode fault currents but not from differential mode fault currents, wherein the arc fault detector is coupled to the summer.

41. The combination arc fault and ground fault interrupter of claim 39, further comprising a differential amplifier coupled to the entire secondary winding, wherein the differential amplifier couples signal to the ground fault detector.

42. The combination arc fault and ground fault circuit interrupter of claim 41 in which differential mode currents greater than 5 milliamperes are detected.

43. The combination arc fault and ground fault circuit interrupter of claim 41, further comprising an integrator capacitance, wherein detection by the ground fault detector of di/dt signal is prevented.

44. The combination arc fault and ground fault circuit interrupter of claim 39, further comprising a capacitor coupled to each secondary winding segment to establish a resonant frequency.

45. A sensor for an arc fault detecting device for protecting an electric power circuit including a neutral wire and a hot wire, comprising:

a transformer with the neutral and hot wires forming primaries of said transformer, and a secondary winding of said transformer wound intermediate the hot wire and neutral wire, wherein the secondary winding senses common mode currents carried by the hot wire, the neutral wire, or both wires which do not involve ground but does not sense differential mode currents carried by the hot wire, the neutral wire, or both wires which involve ground.

46. The sensor of claim 45, in which the transformer further comprises a core having an air gap, wherein the air gap is in a leg portion of the core located along a line that is perpendicular to a line which bisects the cross-sections of the hot and neutral wires, and wherein said secondary winding surrounds said leg portion.

47. The sensor of claim 46, in which the transformer includes a core, wherein said core has a coupling to enable electrical connection to circuit common to eliminate sensitivity to electric field noise.

48. The sensor of claim 47, wherein said coupling includes at least one of a solid contact, friction contact, conductive coating, and bare wire wrap.

* * * * *

UNITED STATES PATENT AND TRADEMARK OFFICE
CERTIFICATE OF CORRECTION

PATENT NO. : 6,876,528 B2
DATED : April 5, 2005
INVENTOR(S) : Bruce F. Macbeth It is certified that error appears in the above-identified patent and that said Letters Patent is hereby corrected as shown below:

<u>Title page,</u>
Item [73], Assignee, should read -- Pass & Seymour, Inc., Syracuse, NY (US) --.

Signed and Sealed this

Sixth Day of September, 2005

JON W. DUDAS
*Director of the United States Patent and Trademark Office*